United States Patent [19]
Dreifus et al.

[11] Patent Number: 5,382,808
[45] Date of Patent: Jan. 17, 1995

[54] METAL BORIDE OHMIC CONTACT ON DIAMOND AND METHOD FOR MAKING SAME

[75] Inventors: David L. Dreifus, Cary; Gary A. Ruggles, Raleigh, both of N.C.

[73] Assignee: Kobe Steel, USA Inc., Research Triangle Park, N.C.

[21] Appl. No.: 62,350

[22] Filed: May 14, 1993

[51] Int. Cl.$^6$ ............................................. H01L 23/48
[52] U.S. Cl. ........................................ 257/77; 257/607; 257/742
[58] Field of Search .................. 257/77, 607, 734, 741, 257/748, 763, 764, 742, 770

[56] References Cited

U.S. PATENT DOCUMENTS

| | | | |
|---|---|---|---|
| 4,113,532 | 9/1978 | Authier et al. | 148/174 |
| 4,982,243 | 1/1991 | Nakahata et al. | 357/15 |
| 5,055,424 | 10/1991 | Zeidler et al. | 437/188 |
| 5,075,757 | 12/1991 | Ishii et al. | 357/67 |
| 5,210,431 | 5/1993 | Kimoto et al. | 257/77 |
| 5,254,862 | 10/1993 | Kalyankjumar et al. | 257/77 |

FOREIGN PATENT DOCUMENTS 2236902  4/1991  United Kingdom .

OTHER PUBLICATIONS

Shiomi et al., "*Electrical Characteristics of Metal Contacts to Boron-Doped Diamond Epitaxial Film*", Japan J. Appl. Physics, vol. 28, pp. 758–762, 1989.
Grot et al., "*The Effect of Surface Treatment on the Electrical Properties of Metal Contacts to Boron-Doped Homoepitaxial Diamond Film*", IEEE Electron Device Letters, vol. 11, No. 2, Feb. 1990.
Moazed et al., "*A Thermally Activated Solid State Reaction Process for Fabricating Ohmic Contacts to Semiconducting Diamond*", J. Appl. Phys. 68 (5), 1 Sep. 1990.
Tsai et al., "*Diamond MESFET Using Ultrashallow RTP Boron Doping*", IEEE Electron Device Letters, vol. 12, No. 4, Apr. 1991.

*Primary Examiner*—Rolf Hille
*Assistant Examiner*—Roy Potter
*Attorney, Agent, or Firm*—Bell, Seltzer, Park & Gibson

[57] ABSTRACT

An ohmic contact includes a metal boride layer on a semiconducting diamond layer. The metal boride preferably includes boron and a transition metal and, more preferably, a refractory metal. Heating of the metal boride layer and diamond during fabrication forms a highly boron-doped surface portion of the semiconductor diamond by boron diffusion. Alternately, the highly doped surface portion may be formed by selective ion implantation, annealing to form a graphitized surface portion, and removing the graphitized surface portion by etching to thereby expose the highly doped surface portion. The highly doped surface portion lowers the electrical resistivity of the contact. In addition, an interface region of a carbide may also be readily formed by heating. The carbide interface region enhances mechanical adhesion of the metal boride and also serves to lower the electrical resistance of the contact. The ohmic contact may be incorporated into many semiconductor devices including, for example, transistors, diodes, and other devices.

18 Claims, 3 Drawing Sheets

METAL BORIDE OHMIC CONTACT ON DIAMOND AND METHOD FOR MAKING SAME

FIELD OF THE INVENTION

The invention relates to the field of semiconductor devices, and more particularly, to an ohmic contact for use with diamond semiconductor devices, and an associated fabrication method for the contact.

BACKGROUND OF THE INVENTION

Diamond is a preferred material for semiconductor devices because it has semiconductor properties that are better than traditionally used silicon, germanium, or gallium arsenide. Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 Ev at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments. In other words, diamond is also a "radiation-hard" material.

Because of the advantages of diamond as a material for semiconductor devices, there is at present an interest in the growth and use of diamond for high temperature and radiation-hardened electronic devices. Key to many of such devices, such as diodes and field effect transistors (FET's), is an ohmic contact having good electrical and mechanical characteristics even at relatively high operating temperatures. Consequently, the fabrication of ohmic contacts on diamond will play an important role in the development of future diamond-based semiconductor devices.

Ohmic contacts have reportedly been obtained on semiconducting diamond. For example, U.S. Pat. No. 5,055,424, to Zeidler et al. discloses a refractory metal layer forming an ohmic contact on semiconducting diamond. The patent to Zeidler et al. also discloses a refractory metal carbide interface region between the diamond layer and the refractory metal layer formed by heating the structure. Similarly, Moazed et al. in *A Thermally Activated Solid State Reaction Process for Fabricating Ohmic Contacts to Semiconducting Diamond*, J. App. Phys., 68(5), Sept. 1990, discloses annealing a refractory metal, that is, molybdenum, at 950° C. to grow carbide precipitates at an original diamond/metal interface to provide an electrical contact with good electrical performance and with good mechanical adhesion at relatively high operating temperatures.

The electrical resistivity of ohmic contacts to diamond has also been improved by highly doping the surface region of the diamond underlying a metal contact as disclosed, for example, by Tsai et. al., in *Diamond MESFET Using Ultrashallow RTP Boron Doping*, IEEE, Electron Dev. Letters., Vol. 12, No. 4, Apr. 1991. The Tsai et al. article discloses using cubic boron nitride in a solid state diffusion process including rapid thermal annealing for more highly doping the surface portion of the diamond layer. An article to Prins entitled *Preparation of Ohmic Contacts to Semiconducting Diamond*, pp. 1562-1564, July 1989, discloses ion implantation to more highly boron dope a surface of diamond underlying a metal contact layer to lower resistivity.

Another approach to obtaining a highly doped diamond surface portion adjacent a metal contact layer is disclosed in an article by Grot et al. in *The Effect of Surface Treatment on the Electrical Properties of Metal Contacts to Boron-Doped Homoepitaxial Diamond Film*, IEEE Electron Dev. Letters. Vol. 11, No. 2, Feb. 1990. The article discloses placing boron powder near edges of a diamond substrate and then exposing the powder and the diamond to a hydrogen plasma to thereby highly dopes the diamond surface portion with boron.

Ishii et al., in U.S. Pat. No. 5,075,757 teaches a non-metal ohmic contact formed by a highly boron-doped silicon layer on a diamond layer, wherein the silicon is amorphous or polycrystalline including microcrystalline silicon phase. The diamond region underlying the silicon layer becomes more highly doped by boron diffusion from the silicon layer into the diamond surface.

Despite continuing attempts to obtain low resistivity ohmic contacts to diamond also having good mechanical adhesion even at elevated temperatures, there still exists a need for such contacts which may be readily fabricated.

SUMMARY OF THE INVENTION

It is therefore an object of the present invention to provide a high temperature, low resistance ohmic contact to diamond also having good mechanical adhesion even at elevated operating temperatures.

It is another object of the present invention to provide such an ohmic contact having good electrical and mechanical properties that may be readily fabricated.

These and other objects, features and advantages according to the present invention are provided by an ohmic contact including a metal boride layer on a semiconducting diamond layer. The semiconducting diamond layer preferably includes a highly boron-doped surface portion adjacent the metal boride layer to thereby provide low electrical resistance. In addition, a carbide interface region may be readily formed between the diamond and metal boride layers by heating the as-deposited metal boride and diamond layers. The carbide interface region provides lower electrical resistance and enhanced adhesion between the metal boride and diamond layers.

As would be readily understood by those skilled in the art, the ohmic contact according to the invention may be incorporated into many types of semiconductor devices, such as transistors, diodes, thyristors, and other devices which require an ohmic contact for establishing an electrical connection to a semiconducting diamond layer.

The metal boride of the ohmic contact preferably includes a transition metal and boron. The transition metal is preferably a refractory metal to enable operation at elevated temperatures that are achievable using diamond as the semiconductor material. The refractory metal is preferably selected from the group consisting of titanium, tantalum, molybdenum, tungsten, hafnium and niobium. A passivating, or protective, layer is preferably provided on the metal boride layer opposite the diamond layer. The passivating layer may be platinum or gold or other suitable material to prevent the oxidation of the surface of the metal boride layer, particularly at higher operating temperatures.

The highly boron-doped surface portion of the diamond layer preferably has a dopant level of not less than about $10^{19}$ cm$^{-3}$, and more preferably, the dopant level is in the range of about $10^\circ$ to $10^{21}$ cm$^{-3}$. The semiconducting diamond layer may be either single crystal or polycrystalline diamond. As would be readily understand by those skilled in the art, the semiconducting diamond layer may be a diamond thin film deposited onto and supported by a suitable substrate.

A method for fabricating the ohmic contact according to the invention includes the steps of providing a layer of semiconducting diamond and forming a metal boride layer on the semiconducting diamond layer. The as-deposited metal boride and diamond layers are preferably heated to diffuse boron from the metal boride layer into the adjacent surface portion of the diamond layer. The diffusion of boron into the surface of the diamond creates a highly boron-doped diamond surface portion adjacent the metal boride layer to thereby enhance the electrical performance of the contact. The heating step may also desirably produce the carbide interface region between the diamond and metal boride layers to thereby enhance adhesion and also improve electrical performance.

An alternative method for making the ohmic contact includes forming a highly doped surface portion of the diamond layer prior to depositing the metal boride layer. The highly doped diamond surface portion may be formed by selective ion implantation, annealing to form a graphitized surface portion, and then removing the graphitized surface portion to thereby expose the highly doped surface portion of the diamond layer. A carbide interface region may also be formed by heating the structure.

The metal boride layer may be formed on the diamond layer by sputtering, evaporation, chemical vapor deposition, or molecular beam epitaxy (MBE) as would be readily understood by those skilled in the art. The stoichiometry of the metal boride layer may be controlled to form a metal-rich or boron-rich layer, or otherwise, to thereby obtain desired contact properties. An outer passivating layer, such as platinum or gold, may be applied to the metal boride layer to protect against oxidation. The metal boride layer, such as TiB$_2$, for example, may be patterned and etched using conventional semiconductor processing techniques. In addition, a passivating layer may also be provided to cover the exposed outer surface portion of the semiconducting diamond layer.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The thickness of layers and regions are exaggerated for clarity.

Figure 1:
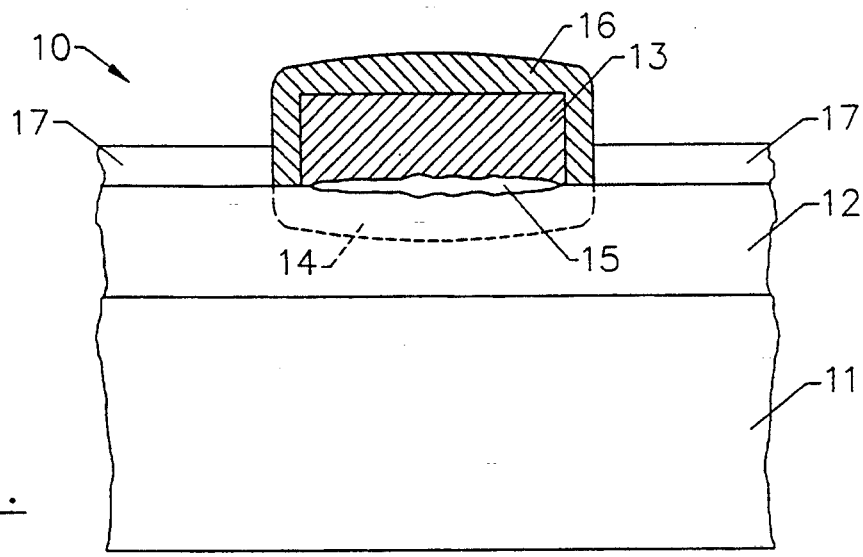
FIG. 1 is a side cross-sectional view of a portion of a semiconductor device including an ohmic contact according to the present invention.

Referring first to FIG. 1, there is shown an ohmic contact 10 according to the invention. As would be readily understood by those skilled in the art, the ohmic contact 10 may be used in a variety of semiconductor devices, such as diodes and FET's, for example.

The ohmic contact 10 includes a substrate 11, such as silicon, diamond, or other suitable material, upon which a semiconducting diamond layer 12 is formed. The semiconducting diamond layer 12 is preferably p-type diamond including boron as the dopant. The semiconducting diamond layer 12 may be either polycrystalline diamond or single crystal diamond depending on the substrate material and the deposition technique used to form the diamond layer, as would be readily understood by those skilled in the art.

A metal boride layer 13 is formed on the semiconducting diamond layer 12 thereby forming the ohmic contact 10. The metal boride includes boron and preferably a transition metal and, more preferably, a refractory metal. Exemplary refractory metals include titanium, tantalum, tungsten, molybdenum, hafnium and niobium. One or more metals may be included in the metal boride. The metal boride layer 13 provides an ohmic contact 10 having low resistivity and stable operation up to relatively high operating temperatures. As is typical for metal contact layers, the metal boride layer 13 preferably has a thickness in the range of about 0.01 to 2.0 μm and, more preferably, 0.02 to 0.2 μm. The metal boride layer 13 may be readily patterned and etched using conventional microelectronic techniques. For example, titanium boride (TiB$_2$) can be controllably patterned and etched in a dilute aqueous solution of hydrogen peroxide.

The metal boride layer 13 may be protected against oxidation, for example, by a subsequent deposition of a passivating layer 16 of gold or platinum. Also, a passivation layer 17 is preferably provided over the exposed surface of the semiconducting diamond layer 12. This passivation layer 17 is preferably SiO$_2$, Si$_3$N$_4$ or other conventional passivant as would be readily known by those skilled in the art.

The ohmic contact 10 preferably includes a highly boron-doped surface portion 14 of the diamond layer 12 underlying the metal boride layer 13 to provide a low resistance for the contact. This highly boron-doped surface portion 14 preferably has a dopant level of not less than about $10^{19}$ cm$^{-3}$ and more preferably, has a dopant level in the range of about $10^{20}$ to $10^{21}$ cm$^{-3}$. In other words, the dopant concentration is at least about $10^{19}$ cm$^{-3}$, and more preferably about $10^{20}$ to $10^{21}$ cm$^{-3}$. Moreover, this highly doped surface portion 14 is readily formed as described in greater detail below.

The ohmic contact 10 also preferably includes a carbide interface region 15 between the diamond layer 12 and the metal boride layer 13. The carbide interface region 15 enhances the mechanical adhesion of the layers 12 and 13 and also reduces the electrical resistance of the ohmic contact 10. The thickness of the carbide interface region 15 is preferably greater than about 20Å to thereby ensure coverage of typical surface irregularities, such as on polycrystalline semiconducting diamond, for example. It is theorized by applicants without wishing to be bound thereto, that the carbide interface region 15 includes carbides of boron and the metal of the metal boride layer, as well as alloys thereof. The predominant carbide is preferably the metal carbide.

Figure 2:
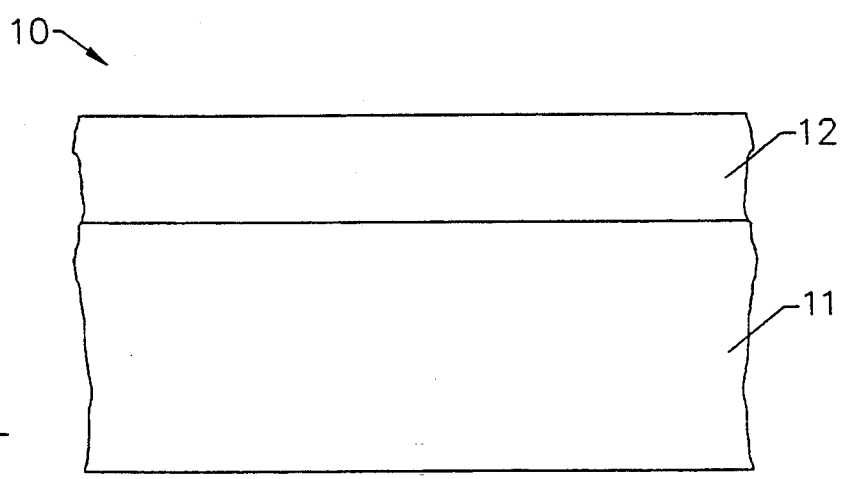
FIGS. 2 through 4 are side cross-sectional views of a portions of a semiconductor device illustrating intermediate steps in fabricating the ohmic contact according to a fabrication method of the present invention.
Figure 3:
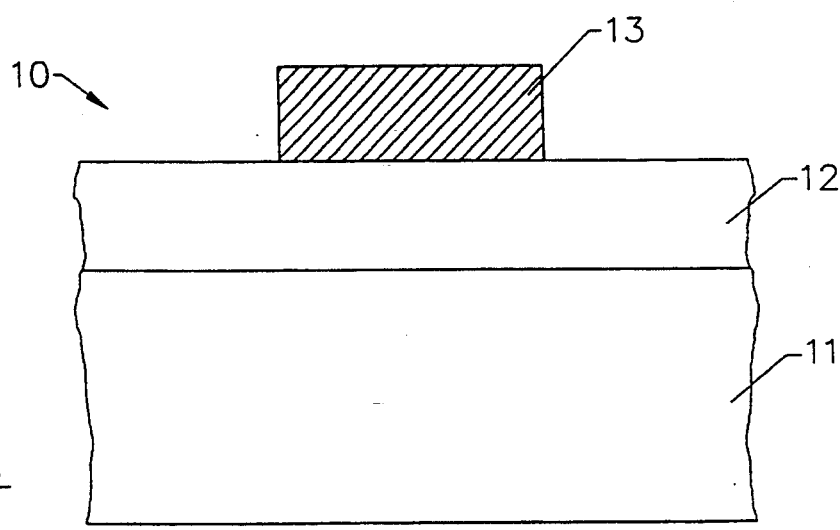
Figure 4:
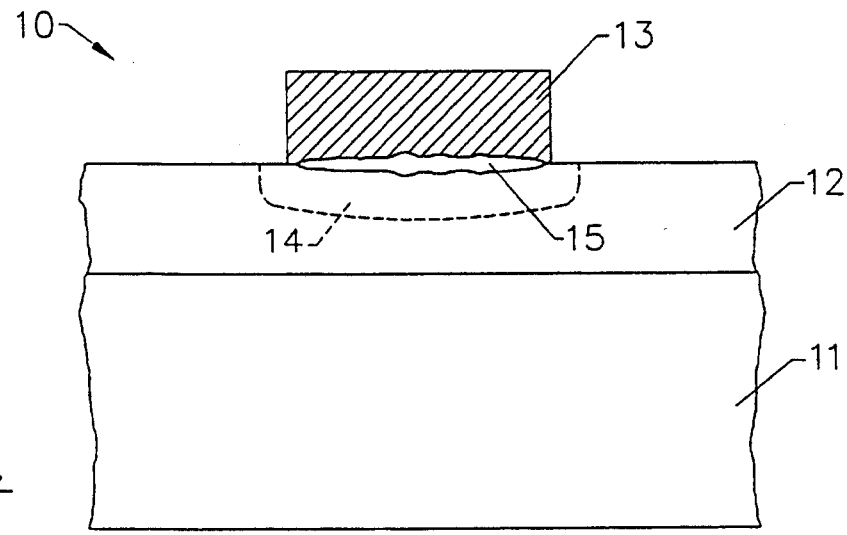

Referring now additionally to FIGS. 2 through 4, a fabrication method for the ohmic contact 10 and other aspects of the present invention are best understood. The method for making the ohmic contact 10 according to the present invention includes providing a semiconducting diamond layer 12, and forming a metal boride layer 13 on the diamond layer. The diamond layer 12 may be readily provided by depositing diamond onto a suitable substrate 11 by conventional deposition techniques to form the intermediate structure 10 illustrated in FIG. 2. As would be readily understood by those skilled in the art, the diamond layer 12 may be deposited onto the substrate 11 by conventional techniques, such as by plasma enhanced chemical vapor deposition, for example. As would also be readily understood by those skilled in the art, the metal boride layer 13 may be formed by conventional deposition techniques including, for example, sputtering, evaporation, chemical vapor deposition, or molecular beam epitaxy (MBE). The stoichiometry of the metal boride layer 13 may also be readily controlled.

The structure 10 shown in FIG. 3 and including the metal boride layer 13 on the diamond layer 12 is then preferably heated to a predetermined temperature and for a predetermined time to cause boron to diffuse from the metal boride layer 13 into the surface portion 14 of the diamond layer 12 to thereby form a highly boron-doped surface portion 14 of the diamond layer. Alternately, the structure 10 may also function as an ohmic contact without further processing.

The structure 10 is preferably heated in an oxygen-containing ambient to a temperature in the range of about 400°–1500° C., and more preferably, in the range of about 600°–1200° C. for a time period in the range of about 10 minutes to 6 hours. The metal boride layer 13 is able to withstand these relatively high temperatures. Moreover, the metal boride layer 13 contributes boron to highly dope the surface portion 14 of the semiconducting diamond layer 12 during the heating step as shown in FIG. 4.

During the heating step to diffuse the boron to form the highly doped surface portion 14 of the diamond layer 12, the carbide interface region 15 may also be produced. The carbide formation will not block diffusion of the boron into the diamond layer 12. Alternatively, the structure 10 may be heated to a lower temperature so that the carbide region 15 forms without substantial diffusion of boron into the underlying diamond layer 12.

As some metal borides, such as TiB$_2$, for example, may oxidize at higher operating temperatures, an outer passivating layer 16 of platinum or gold is preferably formed on the metal boride layer 13. A passivation layer 17 may also be formed on the exposed surface of the semiconducting diamond layer 12 to thereby produce the contact 10 as shown in FIG. 1.

Figure 5:
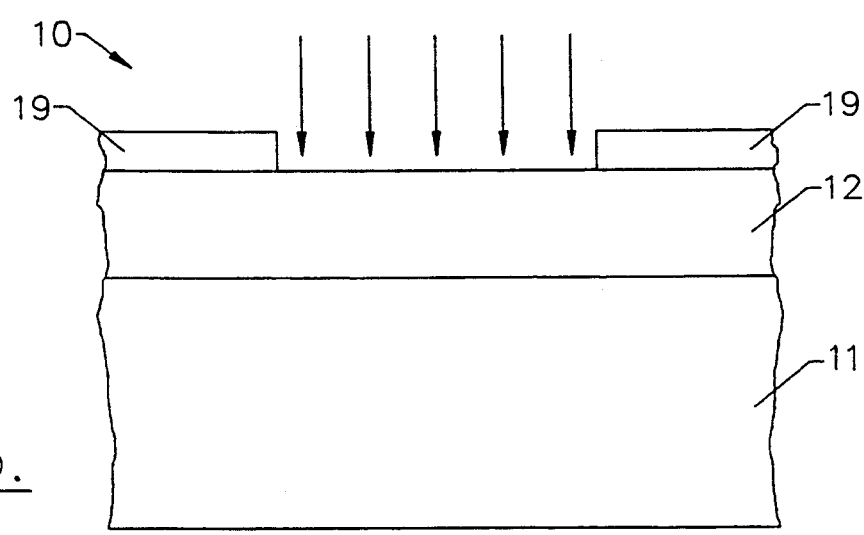
FIGS. 5 through 8 are side cross-sectional views of a portion of a semiconductor device illustrating intermediate steps in fabricating the ohmic contact according to another fabrication method of the present invention.
Figure 6:
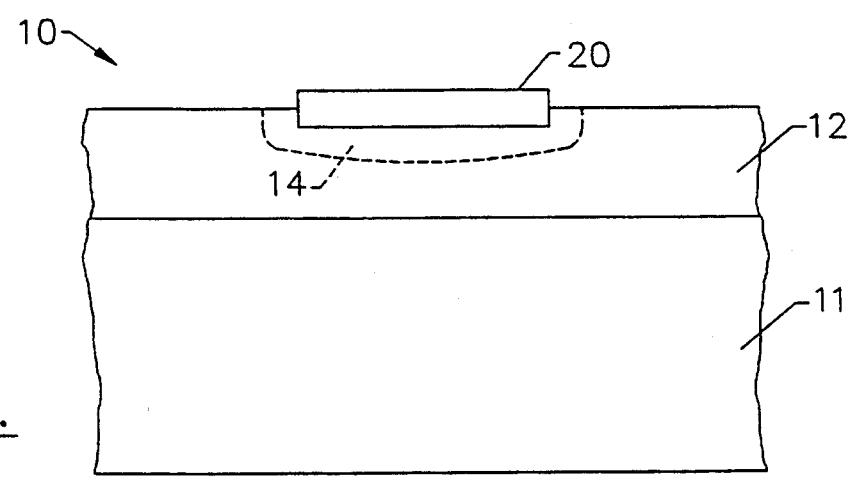
Figure 7:
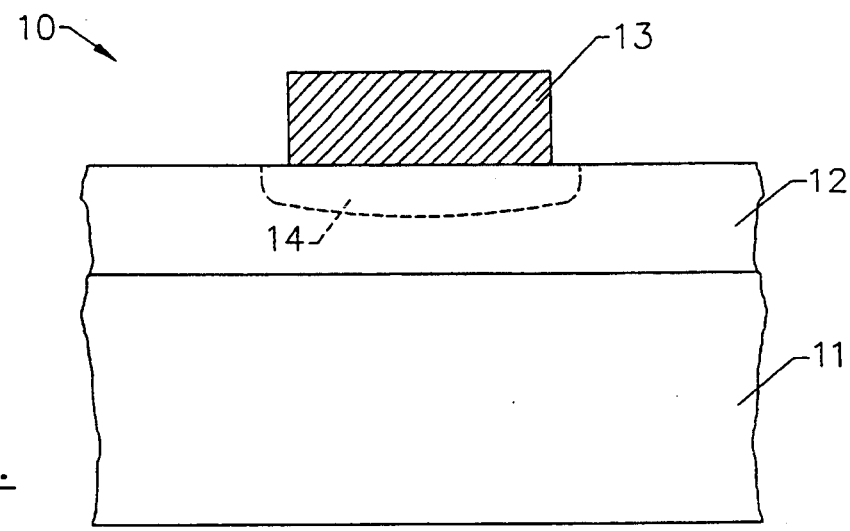

Referring now to FIGS. 5 through 8, another method of making the ohmic contact 10 is explained. The surface of the diamond layer 12 is selectively patterned to produce a mask layer 19, then ion implanted as illustrated in FIG. 5. An anneal at a temperature of about 1200° C. is performed to form a graphitized surface portion 20 as shown in FIG. 6. This graphitized surface portion 20 may then be removed by treating the structure with a hot CrO$_3$+H$_2$SO$_4$ solution to etch away the graphitized surface portion 20. Accordingly, a portion of the implanted boron profile is retained in the diamond layer 12, thus producing a highly doped outer surface portion and onto which a layer of metal boride 13 is deposited as shown in FIG. 7.

Figure 8:
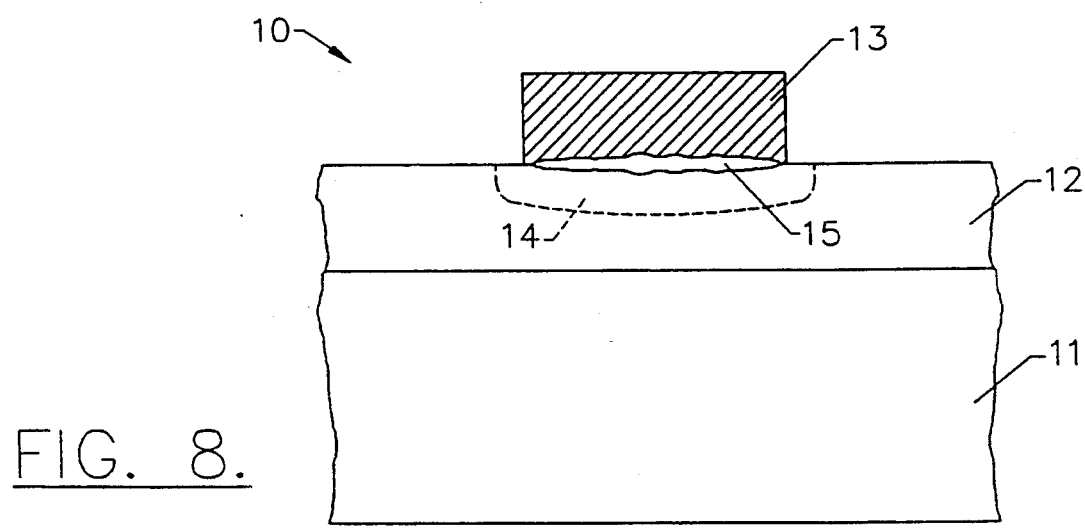

As shown in FIG. 8, the structure may be heated to form the metal carbide interface region 15 as shown. The passivating layers 16 and 17 may then be formed on the metal boride layer 13 and exposed diamond layer 12, respectively, as shown in FIG. 1. The ohmic contact 10 produced by this method may have greater high temperature stability up to and exceeding 500° C. even in an oxygen containing ambient.

One skilled in the art would readily appreciate many diamond-based semiconductor devices advantageously incorporating the ohmic contact of the invention. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A semiconductor device comprising:
    a first layer comprising semiconducting diamond, said first layer including a highly boron-doped surface portion, said highly boron-doped surface portion having a dopant level of at least about $10^{19}$ cm$^{-3}$; and
    a second layer on the highly boron-doped surface portion of said first layer, said second layer comprising a metal boride and forming an ohmic contact with said first layer, the metal of said metal boride being capable of forming a carbide, said metal boride layer having substantially stoichiometric relative proportions of a metal and boron.

2. A semiconductor device according to claim 1 wherein said metal boride includes a transition metal and boron.

3. A semiconductor device according to claim 1 wherein said metal boride includes a refractory metal and boron.

4. A semiconductor device according to claim 3 wherein said refractory metal is selected from the group consisting of titanium, tantalum, molybdenum, tungsten, hafnium and niobium.

5. A semiconductor device according to claim 1 further comprising a passivating layer on said second layer opposite said first layer.

6. A semiconductor device according to claim 1 wherein said semiconducting diamond is single crystal semiconducting diamond.

7. A semiconductor device according to claim 1 wherein said semiconducting diamond is polycrystalline semiconducting diamond.

8. A semiconductor device according to claim 1 further comprising a substrate on said first layer opposite said second layer.

9. A semiconductor device comprising:
 a first layer comprising semiconducting diamond, said first layer including a highly boron-doped surface portion;
 a second layer on the highly boron-doped surface portion of said first layer, said second layer comprising a metal boride and forming an ohmic contact with said first layer, the metal of said metal boride being capable of forming a carbide; and
 a carbide interface region between said first and second layers, said carbide interface region comprising a metal carbide formed from the metal of the metal boride.

10. A semiconductor device according to claim 9 wherein said metal boride includes a transition metal and boron.

11. A semiconductor device according to claim 9 wherein said metal boride includes a refractory metal and boron.

12. A semiconductor device according to claim 11 wherein said refractory metal is selected from the group consisting of titanium, tantalum, molybdenum, tungsten, hafnium and niobium.

13. A semiconductor device according to claim 9 wherein said highly boron-doped surface portion has a dopant level of at least about $10^{19}$ cm$^{-3}$.

14. A semiconductor device according to claim 9 further comprising a passivating layer on said second layer opposite said first layer.

15. A semiconductor device according to claim 9 wherein said semiconducting diamond is single crystal semiconducting diamond.

16. A semiconductor device according to claim 9 wherein said semiconducting diamond is polycrystalline semiconducting diamond.

17. A semiconductor device according to claim 9 further comprising a substrate on said first layer opposite said second layer.

18. A semiconductor device according to claim 9 wherein said metal boride layer has substantially stoichiometric relative proportions of a metal and boron.

* * * * *